(12) United States Patent
Sasaki et al.

(10) Patent No.: US 10,424,520 B1
(45) Date of Patent: Sep. 24, 2019

(54) METHOD OF MANUFACTURING SEMICONDUCTOR DEVICE

(71) Applicant: KOKUSAI ELECTRIC CORPORATION, Tokyo (JP)

(72) Inventors: Takafumi Sasaki, Toyama (JP); Kazuhiro Morimitsu, Toyama (JP); Naofumi Ohashi, Toyama (JP); Tadashi Takasaki, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/291,875

(22) Filed: Mar. 4, 2019

(30) Foreign Application Priority Data

Sep. 26, 2018 (JP) ................ 2018-180010

(51) Int. Cl.
| | |
|---|---|
| *H01L 21/66* | (2006.01) |
| *C23C 16/40* | (2006.01) |
| *C23C 16/52* | (2006.01) |
| *G06N 20/00* | (2019.01) |
| *H01L 21/02* | (2006.01) |

(52) U.S. Cl.
CPC ......... *H01L 22/26* (2013.01); *C23C 16/402* (2013.01); *C23C 16/52* (2013.01); *G06N 20/00* (2019.01); *H01L 21/0228* (2013.01); *H01L 21/02164* (2013.01); *H01L 21/02274* (2013.01)

(58) Field of Classification Search
CPC ..................................................... H01L 22/26
See application file for complete search history.

(56) References Cited

FOREIGN PATENT DOCUMENTS

JP          4455856 B2     2/2010

*Primary Examiner* — Yu-Hsi D Sun
(74) *Attorney, Agent, or Firm* — Volpe and Koenig, P.C.

(57) ABSTRACT

There is provided a technique of manufacturing a semiconductor device, including: by a processing performing part, processing a substrate based on setting parameter corresponding to process recipe stored in a controller; by a first transceiver, transmitting measurement value of the processing performing part to the controller; by the controller, causing a learning part to perform machine learning process on the measurement value received from the first transceiver as learning data; by the controller, after the act of causing the learning part to perform the machine learning process, generating update data for updating the setting parameter; by the controller, causing an arithmetic part to generate update parameter for updating the setting parameter based on the update data; by the controller, causing a second transceiver to transmit the update parameter to the first transceiver; and by the updating part, updating the setting parameter based on the update parameter received from the controller.

9 Claims, 10 Drawing Sheets

FIG. 10

| Measurement timing / Measured value | Timing 1 | | Timing 2 | | Timing 3 | | ... | Timing N | |
|---|---|---|---|---|---|---|---|---|---|
| Measured value 1 (Temperature) | A1 | 310 | A2 | 295 | A3 | 305 | ⋮ | AN | 300 |
| Measured value 2 (Processing chamber pressure) | B1 | 10 | B2 | 10 | B3 | 10 | ⋮ | BN | 10 |
| Measured value 3 (Processing gas flow rate) | C1 | 100 | C2 | 100 | C3 | 100 | ⋮ | CN | 100 |
| ⋮ | ⋮ | ⋮ | ⋮ | ⋮ | ⋮ | ⋮ | ⋮ | ⋮ | ⋮ |
| Measured value M (Valve opening degree) | M1 | 50 | M2 | 50 | M3 | 50 | ⋮ | MN | 50 |
| Film characteristics 1 (Film thickness) | X1 | 60 | X2 | 45 | X3 | 55 | ⋮ | XN | 50 |
| Film characteristics 2 (Film thickness uniformity) | Y1 | 1.3 | Y2 | 0.9 | Y3 | 1.2 | ⋮ | YN | 1.1 |

METHOD OF MANUFACTURING SEMICONDUCTOR DEVICE

CROSS-REFERENCE TO RELATED APPLICATION

This application is based upon and claims the benefit of priority from Japanese Patent Application No. 2018-180010, filed on Sep. 26, 2018, the entire contents of which are incorporated herein by reference.

TECHNICAL FIELD

The present disclosure relates to a method of manufacturing a semiconductor device.

BACKGROUND

With higher integration of semiconductor devices typified by a large scale integrated circuit (LSI), a DRAM (Dynamic Random Access Memory), a flash memory and the like, miniaturization of circuit patterns and structures formed in a manufacturing process has been advanced. In the related art, in order to maintain uniformity of processing quality of different substrates sequentially processed by a substrate processing apparatus, a relationship between a film thickness of a film formed on the substrate and a processing program is computed, and the processing program is adjusted based on the computed relationship.

However, in the related art, there is still a problem of non-uniformity of processing results for different substrates.

SUMMARY

Some embodiments of the present disclosure provide a technique capable of improving processing uniformity of different substrates.

According to an embodiment of the present disclosure, there is provided a technique of manufacturing a semiconductor device in a substrate processing apparatus including a plurality of devices and a controller communicating with the plurality of devices, each of the plurality of devices including a processing performing part, a first transceiver, and an updating part, and the controller including a learning part, an arithmetic part, and a second transceiver. The technique includes: by the processing performing part, processing a substrate based on a setting parameter corresponding to a process recipe stored in the controller; by the first transceiver, transmitting a measurement value of the processing performing part to the controller; by the controller, causing a learning part to perform a machine learning process on the measurement value received from the first transceiver as learning data; by the controller, after the act of causing the learning part to perform the machine learning process, generating update data for updating the setting parameter; by the controller, causing an arithmetic part to generate an update parameter for updating the setting parameter based on the update data; by the controller, causing the second transceiver to transmit the update parameter to the first transceiver; and by the updating part, updating the setting parameter based on the update parameter received from the controller.

BRIEF DESCRIPTION OF DRAWINGS

FIG. 10 is an example of a table of a database.

DETAILED DESCRIPTION

The problems to be solved by the present disclosure are listed below.

A substrate processing system having a plurality of chambers may have the following phenomena (a) to (d) when it processes a plurality of substrates.

(a) A substrate processing apparatus performs a predetermined process on a substrate by controlling a plurality of devices installed in the substrate processing apparatus based on a process recipe. The plurality of devices are controlled so that measurement values obtained by their respective measuring parts approach a set value, and are configured to maintain the state set in the process recipe. However, film characteristics corresponding to the process recipe may not be obtained due to a combination of deviations between the measurement values of the plurality of devices and the set value.

(b) In the control of the plurality of devices installed in the substrate processing apparatus, band management is performed to check whether or not the measurement values obtained by the respective devices are within a predetermined range. However, even when the measurement values of the plurality of devices are within the predetermined range, the obtained film thickness may be changed depending on a combination of the measurement values. That is, a predetermined substrate processing may not be performed.

(c) Due to the cumulative operating time of the substrate processing apparatus, the measurement value of the measuring part installed for each of the plurality of devices is different from an actual value and a correct value cannot be obtained, whereby the predetermined substrate processing may not be performed. There is a technique for predicting a deterioration situation of the measuring part depending on the cumulative operating time. However, the deterioration situation may be out of expectation depending on the use history and operating conditions of the substrate processing apparatus.

(d) In a case where the substrate processing apparatus has a film thickness model corresponding to the process recipe, an actual film thickness may differ from the film thickness model when processing is executed plural times in the substrate processing apparatus.

Hereinafter, embodiments of the present disclosure will be described.

A representative embodiment of the present disclosure will be now described with reference to the drawings. Hereinafter, a substrate processing system according to the present embodiment will be described.

(1) Configuration of Substrate Processing System

Figure 1:
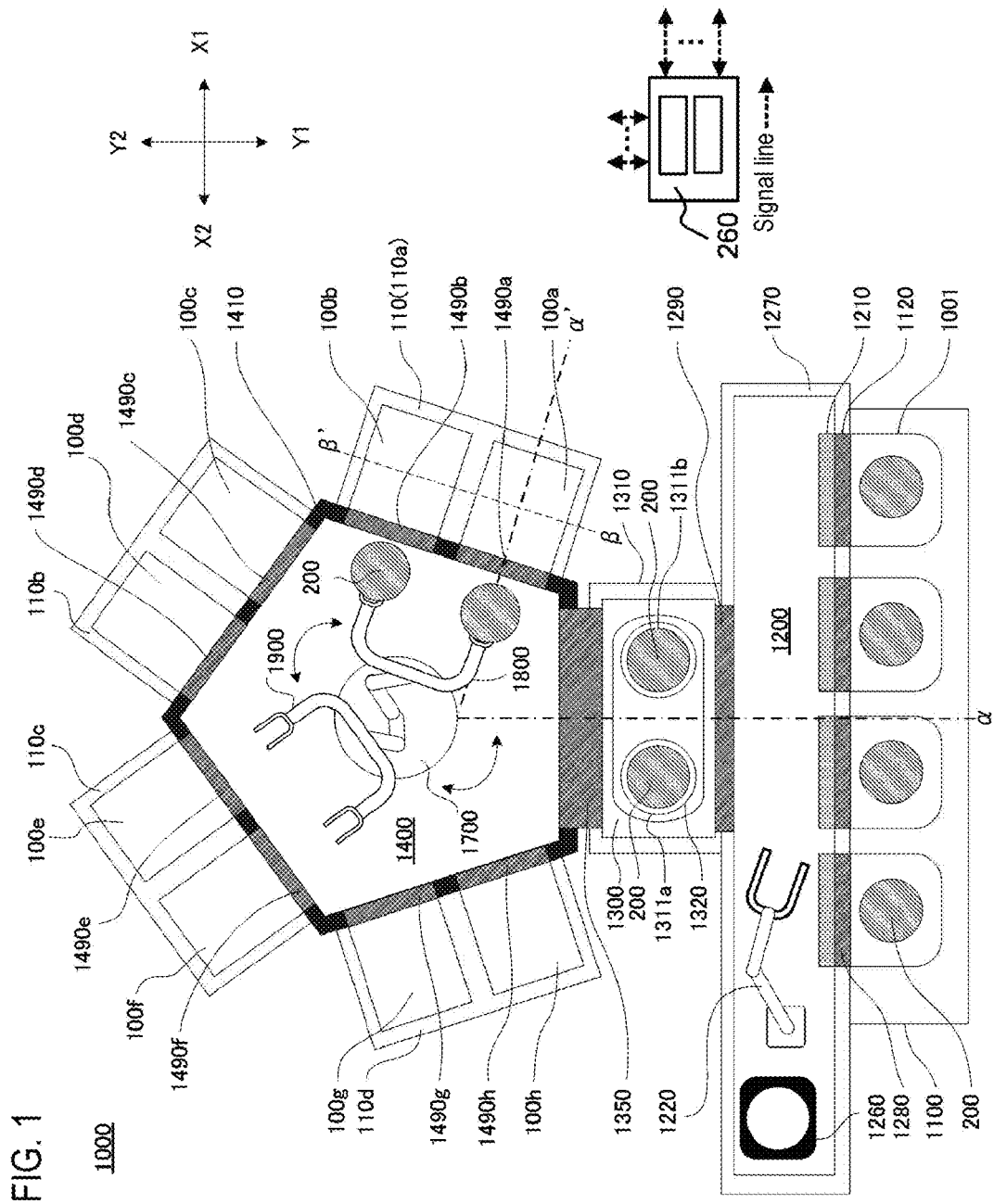
FIG. 1 is a schematic cross-sectional view of a substrate processing system.
Figure 2:
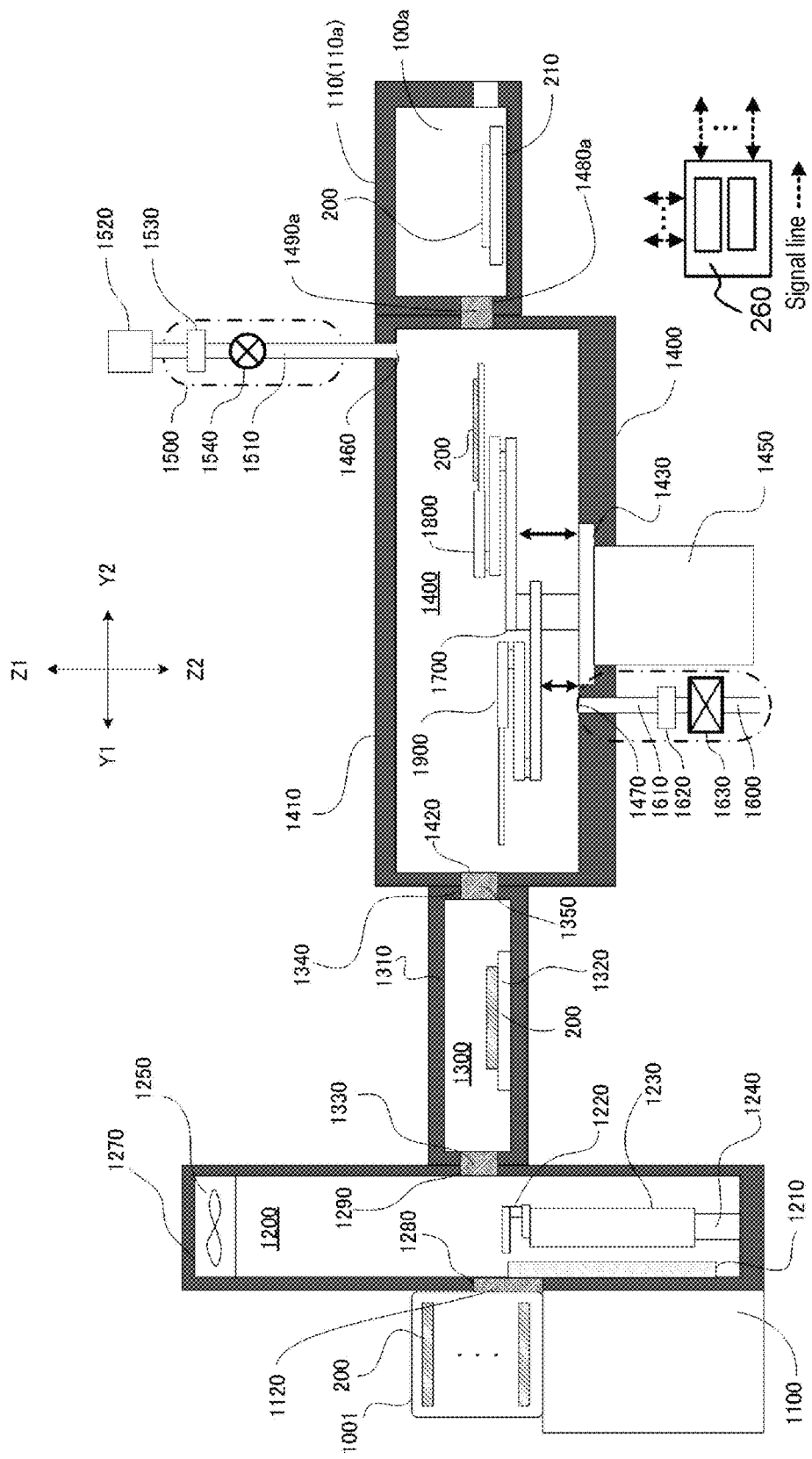
FIG. 2 is a schematic longitudinal sectional view of the substrate processing system.
Figure 3:
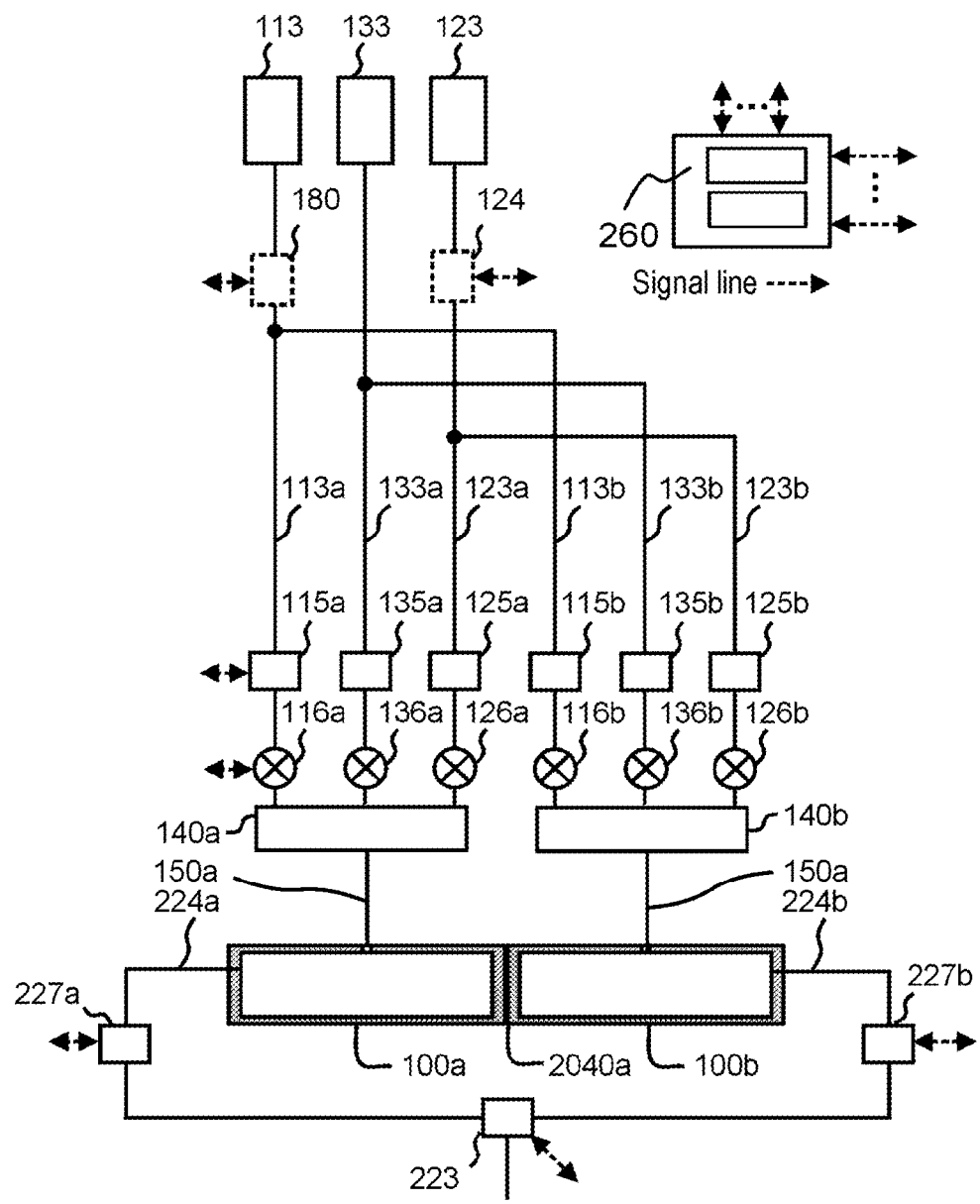
FIG. 3 is a schematic view of a gas supply system and a gas exhaust system of a process module.

The schematic configuration of a substrate processing system according to an embodiment of the present disclosure will be described with reference to FIGS. 1, 2, and 3. FIG. 1 is a cross-sectional view showing a configuration example of the substrate processing system according to the present embodiment. FIG. 2 is a longitudinal sectional view taken along line α-α' in FIG. 1 showing the configuration example of the substrate processing system according to the present embodiment. FIG. 3 is a longitudinal sectional view taken along line β-β' in FIG. 1 and is also an explanatory view for explaining a gas supply system and an exhaust system supplied for a process module.

As shown in FIGS. 1 and 2, a substrate processing system 1000 to which the present disclosure is applied is provided to process a substrate 200 and includes an IO stage 1100, an atmospheric transfer chamber 1200, a load lock (L/L) chamber 1300, a vacuum transfer chamber 1400 and a process module (PM) 110 which is a processing apparatus. Next, each of these components will be described in detail. In the description of FIG. 1, it is assumed that the X1 direction is right, the X2 direction is left, the Y1 direction is front, and the Y2 direction is rear.

[Atmospheric Transfer Chamber/IO Stage]

The IO stage (load port) 1100 is installed in the front of the substrate processing system 1000. A plurality of pods 1001 are mounted on the IO stage 1100. Each pod 1001 is used as a carrier for transferring a substrate 200 such as a silicon (Si) substrate. A plurality of unprocessed substrates (wafers) 200 or processed substrates 200 are stored in a horizontal posture in each pod 1001.

A cap 1120 is installed on the pod 1001 and is opened/closed by a pod opener (PO) 1210. The PO 1210 opens and closes the cap 1120 of the pod 1001 placed on the IO stage 1100 to open/close a substrate loading/unloading port so that the substrate 200 can be loaded into and unloaded from the pod 1001. The pod 1001 is charged in and discharged from the IO stage 1100 by an in-process transfer device (RGV) (not shown).

The IO stage 1100 is adjacent to the atmospheric transfer chamber 1200. A load lock chamber 1300 to be described later is connected to a surface of the atmospheric transfer chamber 1200 different from a surface of the atmospheric transfer chamber 12 to which the IO stage 1100 is connected.

An atmospheric transfer robot 1220, which is a first transfer robot for transferring the substrate 200, is installed in the atmospheric transfer chamber 1200. As shown in FIG. 2, the atmospheric transfer robot 1220 is configured to be raised and lowered by an elevator 1230 installed in the atmospheric transfer chamber 1200 and is further configured to be reciprocated in the lateral direction by a linear actuator 1240.

As shown in FIG. 2, a clean unit 1250 for supplying clean air is installed in an upper portion of the atmospheric transfer chamber 1200. In addition, as shown in FIG. 1, a device (hereinafter, a pre-aligner) 1260 for aligning a notch or an orientation flat formed on the substrate 200 is installed in the left side of the atmospheric transfer chamber 1200.

As shown in FIGS. 1 and 2, the substrate loading/unloading port 1280 for loading/unloading the substrate 200 into/from the atmospheric transfer chamber 1200, and the PO 1210 are installed in the front side of a housing 1270 of the atmospheric transfer chamber 1200. The IO stage 1100 is installed in the opposite side to the PO 1210, that is, in the outside of the housing 1270, with the substrate loading/unloading port 1280 interposed therebetween.

A substrate loading/unloading port 1290 for loading/unloading the substrate 200 into/from the load lock chamber 1300 is installed in the rear side of the housing 1270 of the atmospheric transfer chamber 1200. The substrate loading/unloading port 1290 is opened/closed by a gate valve 1330 to be described later so that the substrate 200 can be loaded/unloaded.

[Load Lock (L/L) Chamber]

The load lock chamber 1300 is adjacent to the atmospheric transfer chamber 1200. The vacuum transfer chamber 1400 to be described later is disposed on a surface of a housing 1310 constituting the L/L chamber 1300, the surface of which is different from a surface to which the atmosphere transfer chamber 1200 is connected. Since internal pressure of the housing 1310 fluctuates in conformity with pressure of the atmospheric transfer chamber 1200 and pressure of the vacuum transfer chamber 1400, the L/L chamber 1300 is structured so as to withstand a negative pressure.

A substrate loading/unloading port 1340 is installed on the side of the housing 1310 adjacent to the vacuum transfer chamber 1400. The substrate loading/unloading port 1340 is opened/closed by a gate valve (GV) 1350 so that the substrate 200 can be loaded and unloaded.

Further, a substrate mounting stand 1320 having at least two mounting surfaces 1311 (1311a and 1311b) on which the substrate 200 is mounted is installed in the L/L chamber 1300. The distance between the substrate mounting surfaces 1311 is set according to the distance between fingers of a vacuum transfer robot 1700 to be described later.

[Vacuum Transfer Chamber]

The substrate processing system 1000 includes the vacuum transfer chamber (transfer module: TM) 1400 which is a transfer chamber serving as a transfer space for transferring the substrate 200 under a negative pressure. A housing 1410 constituting the TM 1400 is formed in a pentagon when viewed from top, and the L/L chamber 1300 and process modules (PMs) 110a to 110d for processing the substrate 200 are connected to the respective sides of the pentagon. The vacuum transfer robot 1700, which is a second transfer robot for transferring the substrate 200 under a negative pressure, is installed substantially in the central portion of the TM 1400 with a flange 1430 as a base. Although it is illustrated herein that the vacuum transfer chamber 1400 is of a pentagonal shape, but it may be of a polygonal shape such as a quadrangle or a hexagon.

A substrate loading/unloading port 1420 is installed on a sidewall of the housing 1410 adjacent to the L/L chamber 1300. The substrate loading/unloading port 1420 is opened/closed by the GV 1350 so that the substrate 200 can be loaded and unloaded.

As shown in FIG. 2, the vacuum transfer robot 1700 installed in the TM 1400 can be raised and lowered while maintaining airtightness of the TM 1400 by an elevator 1450 and the flange 1430. The detailed configuration of the vacuum transfer robot 1700 will be described later. The elevator 1450 is configured to move up and down two arms 1800 and 1900 of the vacuum transfer robot 1700 independently. In addition, each of the two arms 1800 and 1900 is configured to be able to simultaneously transfer two substrates 200.

An inert gas supply hole 1460 for supplying an inert gas into the housing 1410 is formed at a ceiling of the housing 1410. An inert gas supply pipe 1510 is installed in the inert gas supply hole 1460. An inert gas source 1520, a mass flow controller (MFC) 1530 and a valve 1540 are installed in the inert gas supply pipe 1510 in order from an upstream side to control the supply amount of the inert gas to be supplied into the housing 1410.

An inert gas supply part 1500 in the vacuum transfer chamber 1400 includes the inert gas supply pipe 1510, the MFC 1530 and the valve 1540. The inert gas source 1520 and the gas supply hole 1460 may be included in the inert gas supply part 1500.

An exhaust hole 1470 for exhausting the atmosphere of the housing 1410 is formed in a bottom wall of the housing 1410. An exhaust pipe 1610 is installed in the exhaust hole 1470. An automatic pressure controller 1620, which is a pressure controller, and a pump 1630, are installed in the exhaust pipe 1610 in order from an upstream side.

A gas exhaust part 1600 in the vacuum transfer chamber 1400 includes the exhaust pipe 1610 and the automatic pressure controller 1620. The pump 1630 and the exhaust hole 1470 may be included in the gas exhaust part.

The atmosphere of the vacuum transfer chamber 1400 is controlled by cooperation of the inert gas supply part 1500 and the gas exhaust part 1600. For example, an internal pressure of the housing 1410 is controlled.

As shown in FIG. 1, the PMs 110a, 110b, 110c and 110d for performing a desired process on the substrate 200 are respectively connected to the side walls of the housing 1410 on which the load lock chamber 1300 is not installed, of the five side walls of the housing 1410.

Each of the PMs 110a, 110b, 110c and 110d has a chamber 100 which is one configuration of the substrate processing apparatus. Specifically, the PM 110a has chambers 100a and 100b. The PM 110b has chambers 100c and 100 d. The PM 110c has chambers 100e and 100f. The PM 110d has chambers 100g and 100h.

A substrate loading/unloading port 1480 is installed in the side wall of the housing 1410 that faces each chamber 100. For example, as shown in FIG. 2, a substrate loading/unloading port 1480a is installed on the side wall of the housing 1410 that faces the chamber 100a.

A gate valve (GV) 1490 is installed for each chamber, as shown in FIG. 1. Specifically, a gate valve 1490a is installed between the chamber 100a and the TM 1400, and a GV 1490b is installed between the chamber 100b and the TM 1400. A GV 1490c is installed between the chamber 100c and the TM 1400, and a GV 1490d is installed between the chamber 100d and the TM 1400. A GV 1490e is installed between the chamber 100e and the TM 1400, and a GV 1490f is installed between the chamber 100f and the TM 1400. A GV 1490g is installed between the chamber 100g and the TM 1400, and a GV 1490h is installed between the chamber 100h and the TM 1400.

When the substrate loading/unloading port 1480 is opened/closed by each GV 1490, the substrate 200 can be loaded/unloaded through the substrate loading/unloading port 1480.

[Process Module: PM]

Subsequently, among the PMs 110, the PM 110a will be described by way of an example with reference to FIGS. 1, 2, and 3 as examples. FIG. 3 is an explanatory view for explaining the relationship between the PM 110a, a gas supply part connected to the PM 110a and a gas exhaust part connected to the PM 110a.

Here, the PM 110a is described as an example, but other PMs 110b, PM 110c and PM 110d have the same structure as the PM 110a, and therefore, explanation thereof will not be repeated.

As shown in FIG. 3, the PM 110a has the chamber 100a and the chamber 100b of a configuration of the substrate processing apparatus for processing the substrate 200. A partition 2040a is installed between the chamber 100a and the chamber 100b so that the internal atmospheres of the chambers do not mix with each other.

As shown in FIG. 2, the substrate loading/unloading port 1480a is installed on a wall to which the chamber 100a and the vacuum transfer chamber 1400 are adjacent. Likewise, the substrate loading/unloading port 1480a is installed on a wall to which the chamber 100a and the vacuum transfer chamber 1400 are adjacent.

Each chamber 100 has a substrate support part 210 for supporting the substrate 200.

A gas supply part for supplying a processing gas to each of the chamber 100a and the chamber 100b is connected to the PM 110a. The gas supply part includes a first gas supply part (processing gas supply part), a second gas supply part (reaction gas supply part), a third gas supply part (purge gas supply part) and the like, configuration of which will be described later.

Further, the PM 110a has a gas exhaust part for exhausting each of the chamber 100a and the chamber 100b. As illustrated in FIG. 3, one gas exhaust part is configured to exhaust a plurality of chambers.

In this manner, the plurality of chambers installed in the PM is configured to share one gas supply part and one gas exhaust part.

Next, a configuration of each chamber as a substrate processing apparatus will be described.

(2) Configuration of Substrate Processing Apparatus

Figure 4:
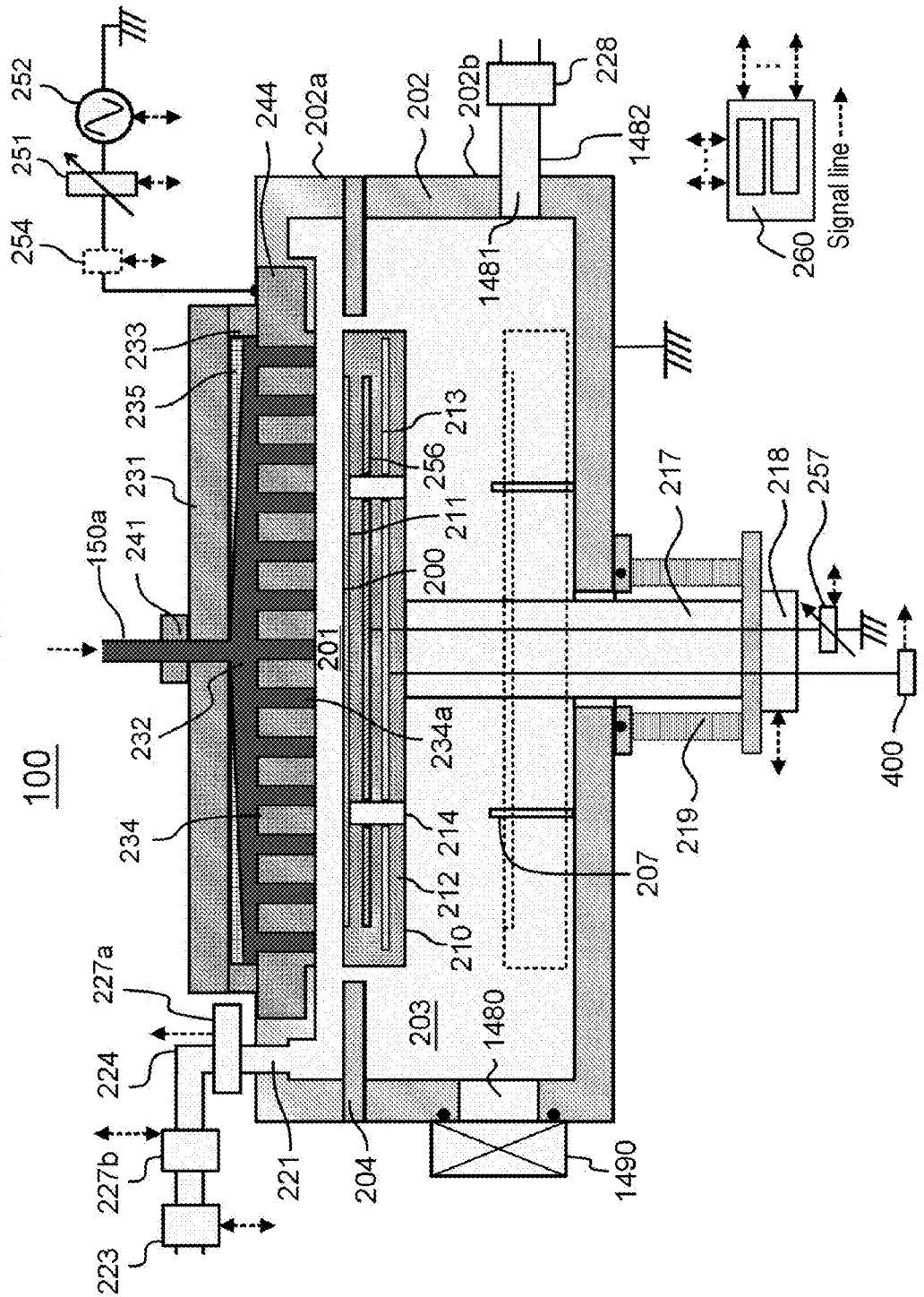
FIG. 4 is a view showing the schematic configuration of a substrate processing apparatus.

The chamber 100 is, for example, an insulating film-forming unit and is configured as a single-wafer-type substrate processing apparatus, as shown in FIG. 4. Here, the chamber 100a will be described.

As shown in FIG. 4, the chamber 100a includes a processing container 202. The processing container 202 has, for example, a circular horizontal section and is configured as a flat closed container. Further, the processing container 202 is made of a metal material such as aluminum (Al) or stainless steel (SUS), or quartz. A processing space (process chamber) 201 for processing a substrate 200 such as a silicon wafer and a transfer space (transfer chamber) 203 are formed in the processing container 202. The processing container 202 includes an upper container 202a and a lower container 202b. A partitioning part 204 is installed between the upper container 202a and the lower container 202b. A space surrounded by the upper processing container 202a above the partitioning part 204 is referred to as a process chamber 201. A space surrounded by the lower container 202b in the vicinity of the gate valve 1490 is referred to as a transfer chamber 203.

The substrate loading/unloading port 1480 adjacent to the gate valve 1490 is installed on in the side surface of the lower container 202b, and the substrate 200 is moved between a transfer chamber (not shown) and the transfer chamber 203 via the substrate loading/unloading port 1480. A plurality of lift pins 207 are installed at the bottom of the lower container 202b. The lower container 202b is grounded.

A substrate support part 210 for supporting the substrate 200 is installed in the process chamber 201. The substrate support part 210 includes a mounting surface 211 on which the substrate 200 is mounted, a mounting stand 212 having the mounting surface 211 on its surface, and a heater 213 as a heating source. Through-holes 214 through which the lift pins 207 penetrate are formed in the substrate mounting stand 212 at positions corresponding to the lift pins 207, respectively. Further, a bias electrode 256 for applying a bias to the substrate 200 or the process chamber 201 may be installed in the substrate mounting stand 212. Here, a temperature measuring part 400 is connected to the heater 213. The temperature measuring part 400 is configured to transmit or receive the temperature information or temperature setting data of the heater 213 to or from a controller 260. Further, the bias electrode 256 is connected to a bias adjusting part 257 configured to adjust the bias. The bias information or bias setting data of the bias adjusting part 257 can be transmitted to or received from the controller 260.

The substrate mounting stand 212 is supported by a shaft 217. The shaft 217 passes through the bottom of the processing container 202 and is connected to an elevating part 218 outside the processing container 202. By operating the elevating part 218 to raise and lower the shaft 217 and the mounting stand 212, it is possible to raise and lower the substrate 200 mounted on the substrate mounting surface 211. The elevating part 218 is configured to transmit or receive height information (position information) or height data (position data) of the substrate mounting stand 212 to or from the controller 260 to be described later. A periphery of a lower end of the shaft 217 is covered with a bellows 219. An interior of the process chamber 201 is kept airtight.

The substrate mounting stand 212 is moved to a wafer transfer position when the substrate 200 is to be transferred, and is moved to a first processing position (wafer processing position) indicated by a solid line in FIG. 4 when the substrate 200 is to be subjected to a first process. The substrate mounting stand 212 is moved to a second processing position indicated by a broken line in FIG. 4 when the substrate 200 is to be subjected to a second process. The wafer transfer position corresponds to a position at which upper ends of the lift pins 207 protrude from an upper surface of the substrate mounting surface 211.

Specifically, when the substrate mounting stand 212 is lowered to the wafer transfer position, the upper ends of the lift pins 207 protrude from the upper surface of the substrate mounting surface 211 so that the lift pins 207 support the substrate 200 from below. When the substrate mounting stand 212 is raised up to the wafer processing position, the lift pins 207 are sunk from the upper surface of the substrate mounting surface 211 so that the substrate mounting surface 211 supports the substrate 200 from below. Since the lift pins 207 make direct contact with the substrate 200, they may be made of a material such as quartz or alumina.

[Exhaust System]

A first exhaust port 221, which is a first exhaust part for exhausting the atmosphere of the process chamber 201, is installed in an inner wall side surface of the process chamber 201 (upper container 202a). An exhaust pipe 224a is connected to the first exhaust port 221, and a pressure measuring part 227a for measuring the pressure in the vicinity of the process chamber 201, an automatic pressure regulator 227b such as an automatic pressure controller for controlling the interior of the process chamber 201 to a predetermined pressure, and a vacuum pump 223 are connected in series to the exhaust pipe 224 in order. A first exhaust system (exhaust line) includes the first exhaust port 221, the exhaust pipe 224a and the pressure regulator 227b. The vacuum pump 223 may be included in the first exhaust system. A second exhaust port 1481 for exhausting the atmosphere of the transfer chamber 203 is installed in the inner wall side surface of the transfer chamber 203. An exhaust pipe 1482 is installed in the second exhaust port 1481. A pressure regulator 228 is installed in the exhaust pipe 1482 so that the internal pressure of the transfer chamber 203 can be exhausted to a predetermined pressure. Further, the internal atmosphere of the process chamber 201 can also be exhausted via the transfer chamber 203. Here, the pressure measuring part 227a is configured as a measuring part to transmit or receive pressure information (pressure data) to or from the controller 260 to be described later via a transmitter installed in the pressure measuring part 227a. The automatic pressure regulator 227b is configured to transmit or receive data such as valve opening degree information and pressure setting data to or from the controller 260 via a transmitter installed in the automatic pressure regulator 227b. The automatic pressure regulator 227b has a regulator as a processing performing part for adjusting the valve opening degree based on the valve opening degree information. Further, the vacuum pump 223 is configured to transmit ON/OFF information, load information and the like of the pump to the controller 260.

[Gas Introduction Port]

A gas introduction port 241 for supplying various gases into the process chamber 201 is installed in the upper surface (ceiling wall) of a shower head 234 installed at the upper portion of the process chamber 201. A configuration of each gas supply unit connected to the gas introduction port 241, which is a gas supply part, will be described later.

[Gas Dispersion Unit]

The shower head 234 as a gas dispersion unit has a buffer chamber 232 and a first electrode 244 as a first activating part. In the first electrode 244, a plurality of holes 234a for dispersedly supplying a gas to the substrate 200 are formed. The shower head 234 is installed between the gas introduction port 241 and the process chamber 201. A gas introduced from the gas introduction port 241 is supplied into the buffer chamber 232 (also referred to as a dispersing part) of the shower head 234 and is then supplied into the process chamber 201 via the holes 234a.

The first electrode 244 is made of conductive metal and is configured as a portion of an activating part (exciting part) for exciting a gas. An electromagnetic wave (high-frequency power or microwave) can be supplied to the first electrode 244. When a lid 231 is formed of a conductive member, an insulating block 233 is installed between the lid 231 and the first electrode 244 to insulate the lid 231 from the first electrode 244.

A gas guide 235 may be installed in the buffer chamber 232. The gas guide 235 has a conical shape whose diameter increases toward a radial direction of the substrate 200 centered at the gas introduction port 241. An horizontal diameter of a lower end of the gas guide 235 is formed so as to extend beyond an end portion of a region where the holes 234a are formed. The gas guide 235 allows a gas to be uniformly supplied into the plurality of holes 234a, thereby making an amount of active species supplied to the surface of the substrate 200 uniform.

[Activating Part (Plasma Generating Part)]

A matching device 251 and a high-frequency power supply 252 are connected to the electrode 244 as the activating part to supply an electromagnetic wave (high-frequency power and microwave). Thus, the gas supplied into the process chamber 201 can be activated. The electrode 244 is configured to generate capacitively-coupled plasma. Specifically, the electrode 244 is formed in a conductive plate shape and configured to be supported by the upper container 202a. The activating part includes at least by the electrode 244, the matching device 251 and the high-frequency power supply 252. An impedance meter 254 may be included in the activating part. The impedance meter 254 may be installed between the first electrode 244 and the high-frequency power supply 252. With the impedance meter 254, it is possible to feedback-control the matching device 251 and the high-frequency power supply 252 based on measurement impedance. The high-frequency power supply 252 is configured to transmit or receive power information and power setting data to or from the controller 260 via a transmitter, the matching device 251 is configured to transmit or receive matching information (traveling wave data and reflected wave data) and matching setting data to or from the controller 260 via the transmitter, and the impedance meter 254 is configured to transmit or receive impedance information to or from the controller 260 via the transmitter.

[Gas Supply System]

A gas supply pipe 150a (150X) is connected to the gas introduction port 241. A first gas, a second gas and a purge gas, which will be described later, are supplied from the gas supply pipe 150X. Here, X is any one of a, b, c, d, e, f, g, and h corresponding to the respective chambers. Hereinafter, a gas supply system connected to the gas introduction port 241 of the chamber 100a will be described, and explanation of other chambers will be omitted.

FIG. 3 is a schematic configuration diagram of a gas supply system including a first gas supply part, a second gas supply part, a purge gas supply part and the like connected to the chamber 100a.

As shown in FIG. 3, a gas supply pipe collecting part 140a is connected to the gas supply pipe 150a. A first gas (processing gas) supply pipe 113a, a purge gas supply pipe 133a and a second gas (processing gas) supply pipe 123a are connected to the gas supply pipe collecting part 140a.

[First Gas Supply Part]

The first gas supply pipe 113a, an MFC 115a and a valve 116a are installed in the first gas supply part. A first gas supply source 113 connected to the first gas supply pipe 113a may be included in the first gas supply part. Further, when a processing gas precursor is liquid or solid, a vaporizer 180 may be installed.

[Second Gas Supply Part]

The second gas supply pipe 123a, an MFC 125a and a valve 126a are installed in the second gas supply part. A second gas supply source 123 connected to the second gas supply pipe 123a may be included in the second gas supply part. In addition, a remote plasma unit (RPU) 124 may be installed to activate the second gas.

[Purge Gas Supply Part]

The purge gas supply pipe 133a, an MFC 135a and a valve 136a are installed in the purge gas supply part. A purge gas supply source 133 connected to the purge gas supply pipe 133a may be included in the purge gas supply part.

Here, each of the MFC and the valve constituting each of the first gas supply part, the second gas supply part and the purge gas supply part has a transmitter, a processing performing part, an updating part and a measuring part and is configured to transmit or receive information to or from the controller 260. The MFC and the valve transmit or receive the following information respectively; the MFC: flow rate information and flow rate setting data, and the valve: opening degree information and opening degree setting data. A vaporizer and an RPU may be added to the configuration of each of the first gas supply part, the second gas supply part and the purge gas supply part. The vaporizer and the RPU transmit or receive the following information respectively; the vaporizer: vaporizer information and vaporizer setting data, and the RPU: power information.

[Controller]

Figure 5:
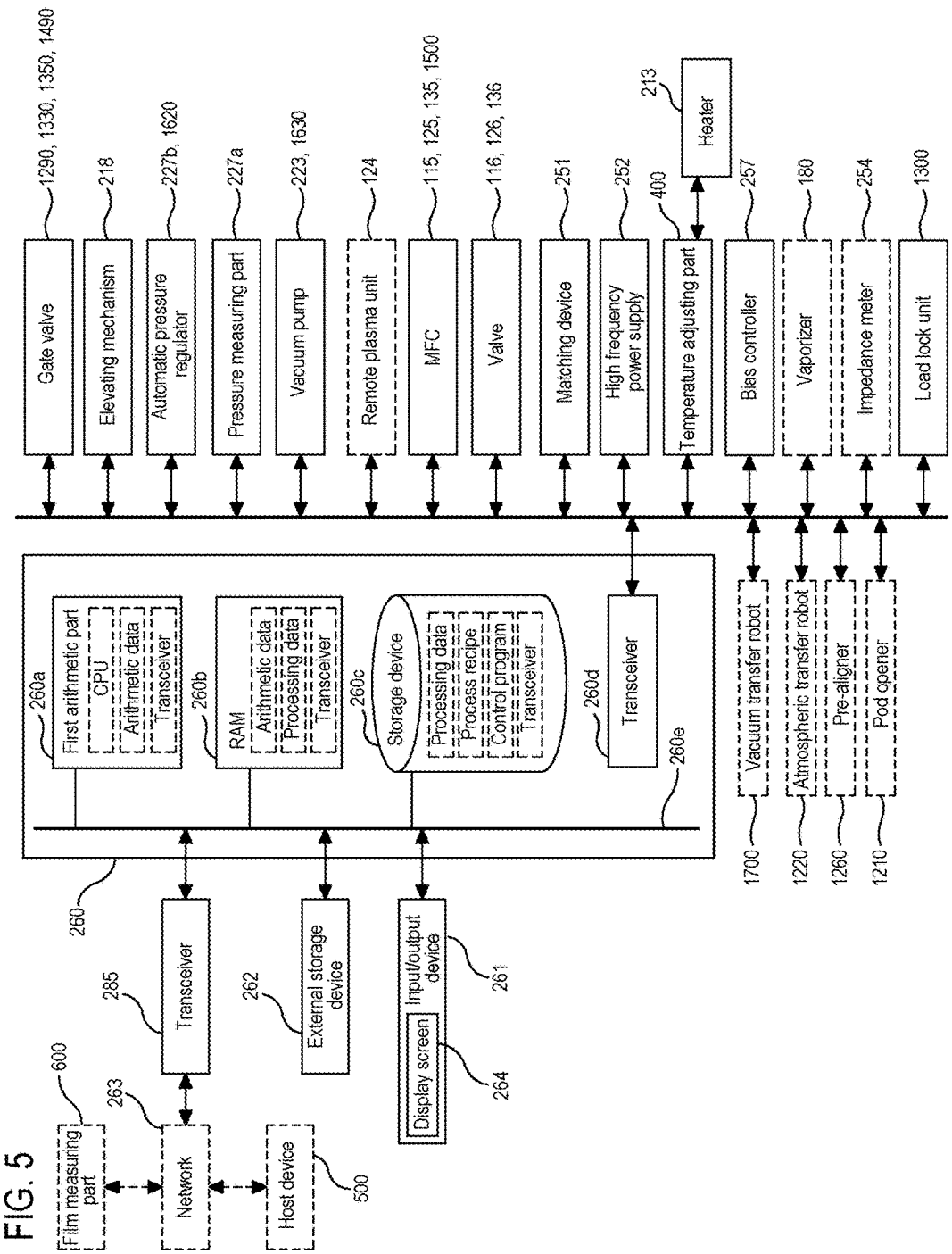
FIG. 5 is a view showing the schematic configuration diagram of a controller.

As shown in FIG. 5, the substrate processing system 1000 and the substrate processing apparatus 100 include the controller 260 for controlling the operation of each part of the substrate processing system 1000 and the substrate processing apparatus 100.

The controller 260 is shown schematically in FIG. 5. The controller 260, which is a controller (control means), is configured as a computer including a CPU (Central Processing Unit) 260a, a RAM (Random Access Memory) 260b, a storage device 260c and a transceiver 260d. The RAM 260b, the storage device 260c and the transceiver 260d are configured to exchange data with the CPU 260a via an internal bus 260e. An input/output device 261 configured as, for example, a touch panel or the like, an external storage device 262, a transceiver 285 and the like can be connected to the controller 260. The input/output device 261 also includes a display screen 264 as a notifying part for notifying a state of the substrate processing apparatus 1000.

The storage device 260c includes, for example, a flash memory, an HDD (Hard Disk Drive) and the like.

The RAM 260b and the storage device 260c are configured to store (record) programs and data shown in (A) to (H) below. When the external storage device 262 is provided, the programs and data may be stored in the external storage device 262. (A) A control program for controlling the operation of each part (each device) installed in the substrate processing apparatus. (B) A process recipe in which a substrate processing process, a processing procedure, conditions and the like to be described later are written. (C) Film characteristic data of a film formed on the substrate 200. The film characteristic data is, for example, film thickness data. (D) Measurement values (measurement data) of each part received by the controller 260. Here, the measurement data include the above-mentioned temperature information, temperature setting data, bias information, bias setting data, height information (position information), height data, pressure information, valve opening degree information, pressure setting data, pump ON/OFF information, load information, power information, power setting information, matching information, matching setting information, impedance information, flow rate information, flow rate setting data, opening degree information, opening degree setting data, vaporizer information, power information, vaporizer setting data and the like. (E) A learning part (learning program) for performing a learning process with the measurement values as learning data. The measurement values used as the learning data include at least the temperature information, the pressure information and the flow rate information. (F) Learning data (learning part). At least the temperature information, the pressure information and the flow rate information are recorded in the learning data, and other information described in the above-described (D) may be added. Further, film characteristic data may be added. The film characteristic data includes film thickness data, film thickness uniformity data and the like. An example of the learning data is shown in FIG. 10. (F) Pre-learning data (one configuration of pre-learning part). The pre-learning data includes at least a database in which a relationship between the film characteristic data and the measurement value data of each part is recorded. Here, the measurement value data of each part includes at least the temperature information, the pressure information and the flow rate information. Other information described in (D) may be added. The film characteristic data includes film thickness data, film thickness uniformity data and the like. (G) Arithmetic data and processing data occurring in a process until the process recipe used to process the substrate 200 is set. (H) Sensor data and soft sensor data.

The process recipes are combined to obtain a predetermined result by causing the controller 260 to execute the respective steps in the substrate processing process to be described later, and functions as a program. Hereinafter, the process recipes, the control program and the like are collectively referred to simply as a program. In the present disclosure, the term "program" may include only a process recipe, only a control program, or both. Further, the RAM 260b is configured as a memory area (work area) in which data such as programs, arithmetic data, processing data and the like read by the CPU 260a are temporarily held.

The transceiver 260d is constituted by an I/O port and is connected to a plurality of devices. The plurality of devices means the devices described below that operate the substrate processing apparatuses. Each of the devices includes, for example, the gate valves 1290, 1330, 1350 and 1490, the elevating part 218, the heater 213, the automatic pressure controllers 227, 228 and 1620, the vacuum pumps 223 (223a, 223b, 223c and 223d) and 1630, the matching device 251, the high-frequency power supply 252, the MFCs 115 (115a, 115b, 115c and 115d), 125 (125a, 125b, 125c and 125d), 135 (135a, 135b, 135c and 135d) and 1530, the valves 116 (116a, 116b, 116c and 116d), 126 (126a, 126b, 126c and 126d), 136 (136a, 136b, 136c and 136d) and 1540, the RPU 124, the vaporizer 180, the bias adjusting part 257, the vacuum transfer robot 1700, the atmospheric transfer robot 1220, and the like described below. Further, the impedance meter 254 may be included.

The CPU 260a as the first arithmetic part is configured to read and execute the control program from the storage device 260c and read the process recipes from the storage device 260c according to an input of an operation command from the input/output device 261 and the like. Further, the CPU 260a is configured to obtain arithmetic data by comparing and calculating the set values input from the transceiver 285, the process recipe and control data stored in the storage device 260c, and the above-described various data. In addition, the CPU 260a is configured to execute a process of determining the corresponding processing data (process recipe) from the arithmetic data. Then, the CPU 260a is configured to control the opening/closing operation of the gate valve 1490, the elevating operation of the elevating part 218, the power supplying operation to the heater 213, the pressure adjusting operation of the pressure regulators 227, 228 and 1620, the ON/OFF control of the vacuum pump 223, the gas flow rate control operation of the MFCs 115, 125, 135 and 1530, the gas activating operation of the RPUs 124, 144 and 154, the gas ON/OFF control of the valves 116, 126, 136 and 1540, the power matching operation of the matching device 251, the power control of the high-frequency power supply 252, the control operation of the bias adjusting part 257, the matching operation of the matching device 251 based on the measurement data obtained by the impedance meter 254, the power control operation of the high-frequency power supply 252, and so on, according to the contents of the read process recipes. The above parts are controlled by the CPU 260a when the transceiver in the CPU 260a transmits and receives the control information according to the contents of the process recipes.

Figure 6:
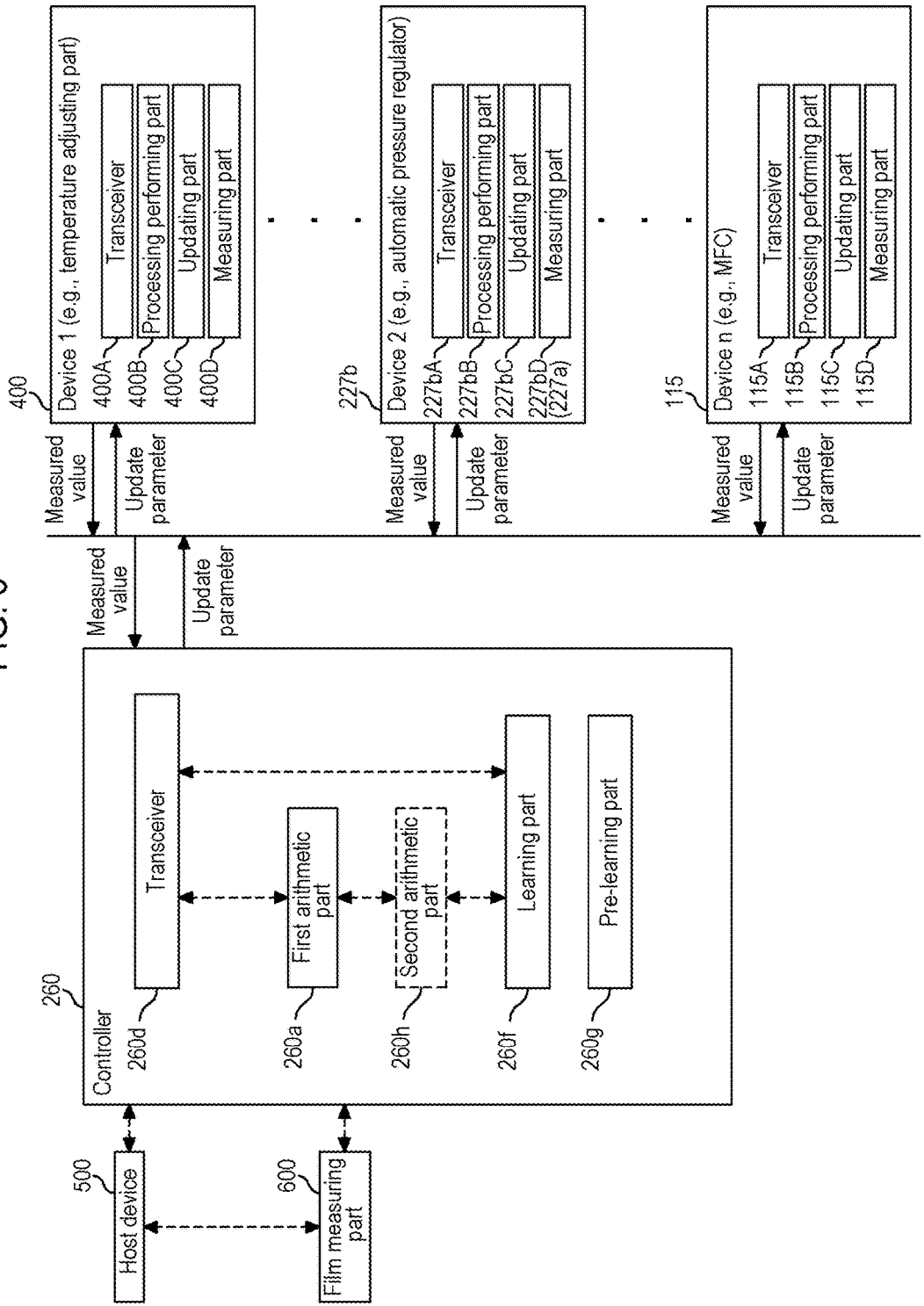
FIG. 6 is a view showing the schematic configuration of a learning system.

As shown in FIG. 6, a CPU 260h as a second arithmetic part for computing the learning to be described later may be installed in the controller 260. As the amount of data handled by the substrate processing apparatus 100 or the substrate processing system 1000 increases, when the control of the substrate processing apparatus and the learning processing (learning computation are processed by one CPU, the processing of the CPU cannot catch up with the increase in the amount of data, which may cause unstable control of the substrate processing process. In addition, in the case where the control of the substrate processing process is preferentially performed, the learning processing cannot catch up with the control, such that the learning process during the substrate processing step or the learning process in every substrate processing cannot be performed, whereby the update parameter may not be generated. By installing the second arithmetic part and causing the second arithmetic part to perform learning, it is possible to improve stability of the substrate processing control in the substrate processing apparatus 100 or the substrate processing system 1000 in the first arithmetic part and perform the learning processing with no delay. Although the example in which the second arithmetic part 260h is installed in the controller 260 is shown here, it may be configured separately from the controller 260. Further, the second arithmetic part 260h may be installed outside the substrate processing apparatus 100 or the substrate processing system 1000. A general purpose CPU similar to the first arithmetic part may be used as the second arithmetic part. In some embodiments, a dedicated CPU may be used as the second arithmetic part.

The controller 260 is not limited to the dedicated computer but may be configured as a general-purpose computer. For example, the controller 260 according to this embodiment can be configured by preparing the external storage device 262 (for example, a magnetic tape, a magnetic disk such as a flexible disk or a hard disk, an optical disk such as a CD or a DVD, a magneto optical disk such as an MO, or a semiconductor memory such as a USB memory or a memory card) that stores the above-described program and installing the program in a general-purpose computer using the external storage device 262. The means for supplying the program to the computer is not limited to being supplied via the external storage device 262. For example, a communication means such as the transceiver 285 or a network 263 (Internet or a dedicated line) may be used to supply the program without going through the external storage device 262. Further, the storage device 260c and the external storage device 262 are configured as a computer-readable recording medium. Hereinafter, these are collectively referred to simply as a recording medium. In the present disclosure, when the term "recording medium" is used, it may include the storage device 260c alone, the external storage device 262 alone, or both.

(2) Substrate Processing Process

Next, as one of processes of manufacturing a semiconductor device, by way of example of a process of forming an insulating film on a substrate, the operations of the above-described substrate processing system 1000 and substrate processing apparatus (chamber) 100 and the evaluation flows and sequences of the respective parts will be described with reference to FIG. 7. Here, for example, a silicon oxide (SiO) film as an oxide film is formed as the insulating film. Further, this manufacturing process is performed in the above-described substrate processing system 1000 and chamber 100. In the following description, the operation of each part is controlled by the controller 260.

In the present disclosure, the term "substrate" is also used in the same way as in the term "wafer". In that case, in the above description, the term "wafer" may be replaced with the term "substrate."

The substrate processing process S200 will be described below.

[Substrate Loading Step S201]

In the substrate processing process S200, first, a substrate 200 is loaded into the process chamber 201. Specifically, the substrate support part 210 is lowered by the elevating mechanism 218 such that the lift pins 207 protrude from the through-holes 214 toward the upper surface side of the substrate support part 210. After adjusting the interior of the process chamber 201 to a predetermined pressure, the gate valve 1490 is opened, and the substrate 200 is mounted on the lift pins 207. After mounting the substrate 200 on the lift pins 207, the substrate support part 210 is raised to a predetermined position by the elevating mechanism 218 such that the substrate 200 is mounted on the substrate support part 210 from the lift pins 207.

[Decompressing/Heating Step S202]

Subsequently, the interior of the process chamber 201 is exhausted through the exhaust pipe 224 so that the interior of the process chamber 201 has a predetermined pressure (degree of vacuum). At this time, based on the pressure value measured by the pressure sensor 227a, the valve opening degree of the APC as the pressure regulator 227b is feedback-controlled. Further, based on the temperature value detected by the temperature sensor (not shown), the amount of current to the heater 213 is feedback-controlled so that the interior of the process chamber 201 has a predetermined temperature. Specifically, the substrate support part 210 is heated in advance by the heater 213, and the substrate 200 is heated to a predetermined temperature by the heated substrate support part 210. It may be kept for a certain period of time until a change in temperature of the substrate 200 or the substrate support part 210 disappears. Meanwhile, when moisture remains in the process chamber 201 or a gas is ejected from a member, the moisture or gas may be removed by vacuum-exhaust or purging by supply of a $N_2$ gas. Thus, preparation before a film-forming step is completed. When exhausting the interior of the process chamber 201 at the predetermined pressure, vacuum-exhaust may be once performed up to a reachable vacuum degree.

[Film-Forming Step S210]

Subsequently, a film-forming step S210 will be described in detail.

Figure 7:
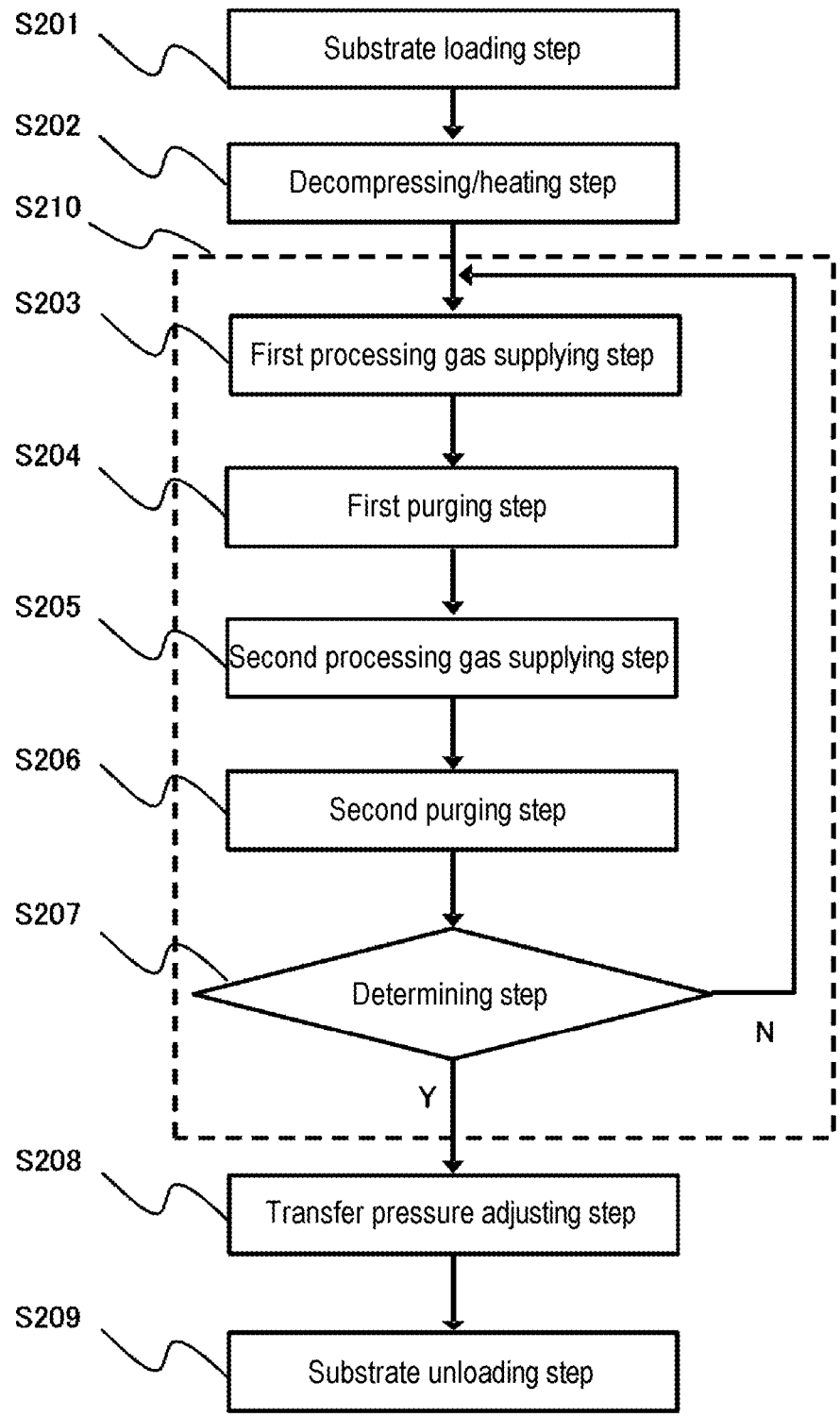
FIG. 7 is an example of a flowchart of a substrate processing process.

After the substrate 200 is mounted on the substrate support part 210, as shown in FIG. 7, steps S203 to S207 are performed.

[First Gas Supplying Step S203]

In a first gas supply step S203, an aminosilane-based gas as a first gas (precursor gas) is supplied from the first gas supply part into the process chamber 201. An example of the aminosilane-based gas may include a bis(diethylamino)silane ($H_2Si(NEt_2)_2$: BDEAS) gas. When the aminosilane-based gas is supplied from the gas source into the chamber 100, the valve 116a on the same side as the process chamber is opened and the flow rate of the aminosilane-based gas is adjusted to a predetermined flow rate by the MFC 115a. The aminosilane-based gas with its flow rate adjusted passes through the buffer space 232 and is supplied into the decompressed process chamber 201 from the holes 234a of the shower head 234. In addition, the exhaust of the interior of the process chamber 201 by the exhaust system is continued, and the internal pressure of the process chamber 201 is controlled to be within a predetermined pressure range (first pressure). At this time, the aminosilane-based gas to be supplied to the substrate 200 is supplied into the process chamber 201 at a predetermined pressure (first pressure: for example, 100 Pa to 20,000 Pa). In this way, the aminosilane-based gas is supplied to the substrate 200. As the aminosilane-based gas is supplied, a silicon-containing layer is formed on the substrate 200.

The temperature of the heater 213 at this time is set to be a constant temperature in the range of 200 to 750 degrees C., or 300 to 600 degrees C. in some embodiments, or 300 to 550 degrees C. in some embodiments, and is maintained at least until the film-forming step S210 is ended.

[First Purging Step S204]

After the silicon-containing layer is formed on the substrate 200, the gas valve 116a of the first gas supply pipe 113a is closed to stop the supply of the aminosilane-based gas. By stopping the precursor gas, a first purging step S204 is performed by exhausting the precursor gas present in the process chamber 201 and the precursor gas present in the buffer space 232 from the exhaust pipe 224.

Further, in the purging step, in addition to discharging the gas by exhausting (evacuating), an inert gas may be supplied to extrude and discharge the residual gas. Specifically, the valve 136a is opened to supply an inert gas. The inert gas is, for example, a nitrogen ($N_2$) gas. In addition, the evacuation and the supply of the inert gas may be performed in combination. Further, the evacuation and the supply of the inert gas may be performed in an alternating manner.

In the first purging step, the operation of the vacuum pump 223 is continued to exhaust the gas remaining in the process chamber 201 from the vacuum pump 223.

After lapse of a predetermined time, the valve 136a is closed to stop the supply of the inert gas.

The supply flow rate of the $N_2$ gas as a purge gas supplied from each inert gas supply system is set to fall within a range of, for example, 100 to 20,000 sccm. As the purge gas, in addition to the $N_2$ gas, a rare gas such as Ar, He, Ne, Xe or the like may be used.

[Second Processing Gas Supplying Step S205]

After the first gas purging step, the valve 126a is opened to supply an oxygen-containing gas as a second gas (reaction gas) into the process chamber 201 via the gas introduction hole 241, the buffer space 232 and the shower head 234. Examples of the oxygen-containing gas may include an oxygen gas ($O_2$), an ozone gas ($O_3$), water ($H_2O$), a nitrous oxide gas ($N_2O$) and the like. An example using the $O_2$ gas is shown here. Since the oxygen-containing gas is supplied into the process chamber 201 via the buffer space 232 and the shower head 234, it is possible to uniformly supply the gas to the substrate. Therefore, the film thickness can be made uniform. When supplying the second gas, an activated second gas may be supplied into the process chamber 201 via the remote plasma unit (RPU) 124 as the activating part (exciting part).

At this time, the MFC 125a is adjusted so that the flow rate of the $O_2$ gas becomes a predetermined flow rate. The supply flow rate of the $O_2$ gas is, for example, 100 sccm or more and 10,000 sccm or less. Further, by appropriately adjusting the pressure regulator 222a, the internal pressure of the process chamber 201 is set to fall within a predetermined pressure range. Further, when the $O_2$ gas is flowing through the RPU 124, the RPU 124 may be controlled to be in an ON state (power-on state) to activate (excite) the $O_2$ gas.

When the $O_2$ gas is supplied to the silicon-containing layer formed on the substrate 200, the silicon-containing layer is modified. For example, a silicon element or a modified layer containing a silicon element is formed. By installing the RPU 124 and supplying the activated $O_2$ gas to the substrate 200, it is possible to form more modified layers.

For example, the modified layer is formed to have a predetermined thickness, a predetermined distribution, and a penetration depth of a predetermined oxygen component or the like with respect to the silicon-containing layer, in accordance with the internal pressure of the process chamber 201, the flow rate of the $O_2$ gas, the temperature of the substrate 200 and the power supply state of the RPU 124.

After lapse of a predetermined time, the valve 126a is closed to stop the supply of the $O_2$ gas.

[Second Purging Step S206]

By stopping the supply of the $O_2$ gas, a second purging step S206 is performed by exhausting the $O_2$ gas remaining in the process chamber 201 and the $O_2$ gas remaining in the buffer space 232 from the first exhaust part. The second purging step S206 is performed in the same manner as the above-described first purging step S204.

[Determining Step S207]

After completion of the second purging step S206, the controller 260 determines whether or not the steps S203 to S206 in the film-forming step S210 have been performed a predetermined number of cycles C (C is a natural number). That is, it is determined whether or not a film having a desired thickness has been formed on the substrate 200. With the above-described steps S203 to S206 as one cycle, by performing this cycle at least once (step S207), an insulating film containing silicon and oxygen having a predetermined film thickness, that is, an SiO film, can be formed on the substrate 200. This cycle may be repeated plural times in some embodiments. Thus, a SiO film having a predetermined film thickness is formed on the substrate 200.

When the cycle of the steps S203 to S206 has not been performed a predetermined number of times ("No" in step S207), the cycle is repeated. When the cycle has been performed the predetermined number of times ("Yes" in step S207), the film-forming step S301 is ended and a transfer pressure adjusting step S208 and a substrate unloading step S209 are executed.

[Transfer Pressure Adjusting Step S208]

In a transfer pressure adjusting step S208, the interior of the process chamber 201 and the interior of the transfer space 203 are exhausted through the exhaust pipe 224 so that the interior of the process chamber 201 and the interior of the transfer space 203 have a predetermined pressure (degree of vacuum). At this time, the internal pressures of the process chamber 201 and the transfer space 203 are adjusted to be equal to or higher than the internal pressure of the vacuum transfer chamber 1400. During, before or after the transfer pressure adjusting step S208, the lift pins 207 may hold the substrate 200 so that the temperature of the substrate 200 is lowered to a predetermined temperature.

[Substrate Unloading Step S209]

After the interior of the process chamber 201 reaches the predetermined pressure in the transfer pressure adjusting step S208, the gate valve 1490 is opened, and the substrate 200 is unloaded from the transfer space 203 to the vacuum transfer chamber 1400.

With such steps, the substrate 200 is processed.

After or in parallel with such a substrate processing process, a learning step in the learning part is performed. After the learning step, a setting updating step S300 for generating an update parameter and updating the setting of each device is performed. This series of steps will be described with reference to FIGS. 6 and 8.

[Measurement Value Collecting Step S301]

Before the learning step, a step of collecting the measurement values of each device is performed. The controller 260 receives data (measurement values) of each device via an I/O port as the transceiver 260d via a network (signal line). The received data of each device are recorded in either or both of the RAM 260b and the storage device 260c. The received data may be transmitted to the host device 500 via the network 263.

[Learning Step S302]

The measurement values received from each device are input as learning data to the learning part (learning program). A learning process is performed in the learning part based on the learning data. Here, the learning is machine learning. As a learning technique, a neural network or deep learning is used. Reinforcement learning may be performed in which pre-learning data are previously recorded as a learning model in the storage part and learning is performed based on the learning data and the pre-learning data. In addition, learning using the pre-learning data as teacher data may be performed. By performing the reinforcement learning or the learning using the teacher data, it is possible to orient the learning and it is also possible to perform an intended learning. In other words, parameters (setting parameters) for improving the processing uniformity for different substrates 200 and different lots can be easily generated.

[Update Parameter Generating Step S302]

Based on the results of the learning process, the closest setting parameter as a parameter (setting parameter) corresponding to the process recipe is generated as an update parameter. A database is used to generate this update parameter. In some embodiments, a neural network may be used to generate the update parameter. In some embodiments, both the neural network and the database may be used to generate update parameters, and the generated update parameters may be compared and computed to generate an update parameter to be finally applied.

[Parameter Updating Step S303]

The generated update parameter is transmitted from the transceiver 260d of the controller 260 to each device. In each device, the setting value is reset based on the received update parameter.

Here, as an example, for the heating part, the temperature information is transmitted as a measurement value from the temperature regulator to the controller 260. The controller inputs the temperature information as first learning data to the learning part. The learning part sets the setting of the heating part close to the temperature setting corresponding to the process recipe as an update parameter. The controller transmits the generated update parameter to the temperature regulator. The temperature regulator updates the setting of the temperature regulator based on the received update parameter. The setting of the temperature regulator is either temperature or temperature control parameter, or both. For example, in a case of PID control, the temperature control parameter is a value of each of P, I and D. The temperature control may be performed by a method other than PID.

[Film Thickness data Comparing Step S304]

Virtual film thickness data corresponding to the measurement values are read from the pre-learning data. The read virtual film thickness data are compared with the film thickness data corresponding to the process recipe to calculate difference data (Δ film thickness data) indicating a difference between the virtual film thickness data and the film thickness data.

[Determining Step S305]

In a determining step S305, it is determined whether or not the Δ film thickness data calculated by the film thickness data comparing step is within a predetermined range. When the Δ film thickness data is within the predetermined range, an "Y" determination is made (YES determination). When the Δ film thickness data is not within the predetermined range, an "N" determination is made (NO determination). In case of the "Y" determination, a learning part updating step S306 is performed. In case of "N" determination, an alarm notifying step S307 is performed.

[Learning Data Updating Step S306]

In a learning data updating step S306, a relationship between the update parameter and the film thickness data is recorded in the learning part (learning program). When data in which the film thickness data and the process recipe are associated is received from the host device 500, the film measuring part 600 or the like, the parameter corresponding to the received process recipe and the film thickness data may be recorded as teacher data in the learning part.

[Alarm Notifying Step S307]

In an alarm notifying step S307, when the substrate processing is performed based on the update parameter, a message indicating a possibility that the thickness of a film formed on the substrate 200 deviates from the film thickness data is notified to a display part.

Figure 9:
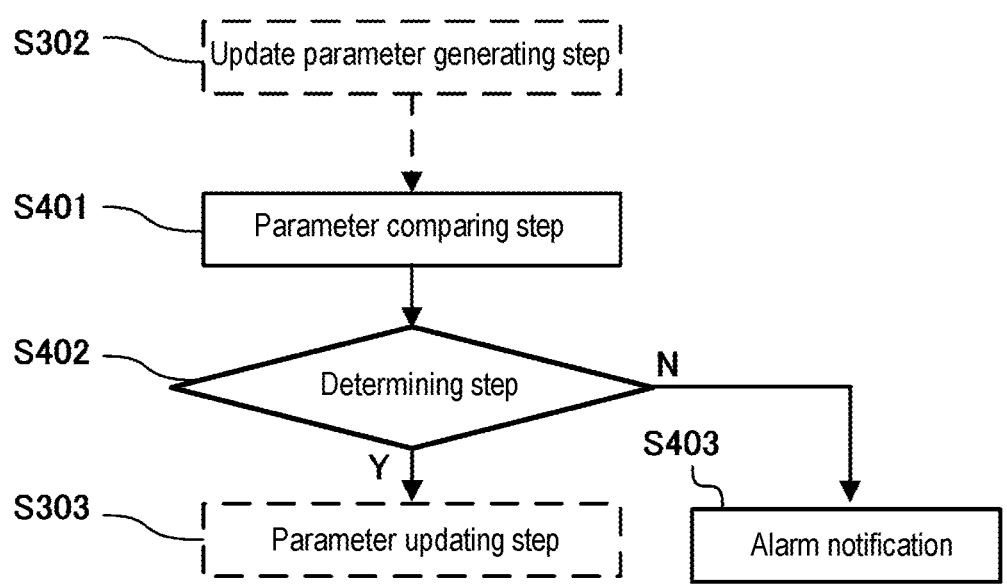
FIG. 9 is an example of a flowchart of a setting updating process.

In this manner, the setting updating step S300 is performed. Further, in parallel with the setting updating step S300, a learning data checking step S400 may be performed. The learning data checking step S400 will be described with reference to FIG. 9.

Figure 8:
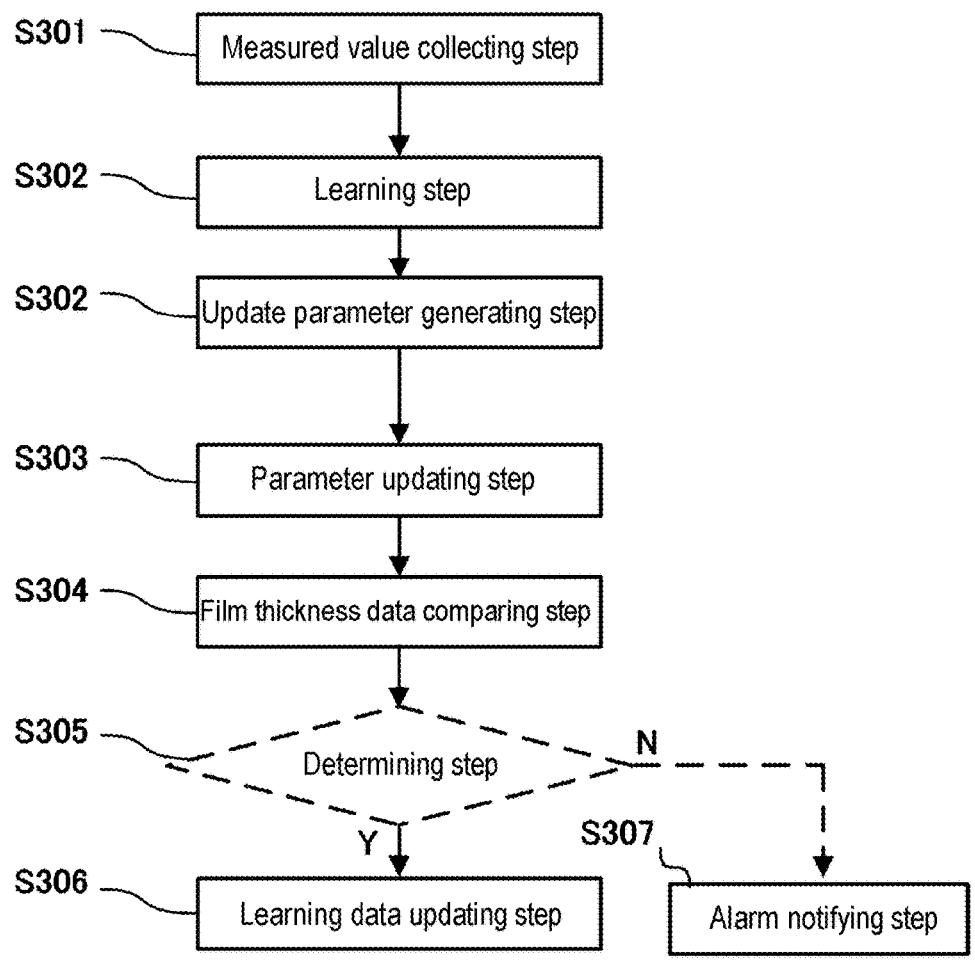
FIG. 8 is an example of a flowchart of a setting updating process.

The learning data checking step S400 is performed after the update parameter generating step S302 shown in FIG. 8.

[Parameter Comparing Step S401]

First, a pre-learning parameter corresponding to a measurement value of each device is read from the pre-learning data. Then, a A parameter indicating a difference between the update parameter and the pre-learning parameter is generated.

[Determining Step S402]

Next, it is determined whether or not the A parameter is within a predetermined range. That is, it is determined whether or not a difference between the update parameter and the pre-learning parameter is within a predetermined range. When the A parameter is within the predetermined range, an "Y" determination is made (YES determination). When the A parameter is not within the predetermined range, an "N" determination is made (NO determination). In case of the "Y" determination, it is determined that the update parameter is correct, and the above-described parameter updating step S303 is performed. In case of "N" determination, it is determined that the update parameter is incorrect, and an alarm notifying step S403 is performed.

[Alarm Notifying Step S403]

In an alarm notifying step S403, a message window corresponding to message data indicating that a measuring part of each device is to be exchanged is displayed on the display screen 264. This message data may be transmitted to the host device 500.

In this manner, the setting updating step S300 is performed.

[Learning Timing Changing Step]

The learning timing or cycle may be appropriately changed. For example, when the substrate processing apparatus 100 or the substrate processing system 1000 is driven, the substrate processing step S200 and the setting updating step S300 may be executed in parallel and the learning process may be executed in real time at the initial stage when a new process recipe is applied. With this configuration, it is possible to perform tuning for each step. Further, the substrate processing step S200 and the setting updating step S300 may be sequentially performed. With this configuration, it is possible to perform the learning process based on data throughout the substrate processing step S200 and it is also possible to perform tuning of the thermal history.

Although the embodiments of the present disclosure have been concretely described above, the present disclosure is not limited to the above-described embodiments but various modifications can be made without departing from the spirit and scope of the present disclosure.

In addition, although the method of forming a film by supplying the first gas and the second gas alternately has been described above, the present disclosure is also applicable to other methods. For example, the present disclosure can be applied to a method in which the supply timing of the first gas and the supply timing of the second gas overlap with each other.

In addition, although the method of supplying and processing two kinds of gases has been described above, the present disclosure is also applicable to a process using one kind of gas.

In addition, although the film-forming process has been described above, the present disclosure is also applicable to other processes such as diffusion, oxidation, nitridation, oxynitridation, reduction, oxidation reduction, etching, heating and the like using plasma. For example, the present disclosure may also be applied to a case where a substrate surface or a film formed on a substrate is subjected to plasma oxidation or plasma nitridation. Further, the present disclosure may be applied to the case where plasma annealing is performed using only a reaction gas.

In addition, although the process of manufacturing a semiconductor device has been described above, the present disclosure according to the embodiments is also applicable to processes other than the semiconductor device manufacturing process. For example, such processes include a process of manufacturing a liquid crystal device, a process of manufacturing a solar cell, a process of manufacturing a light emitting device, a process of processing a glass substrate, a process of processing a ceramic substrate, a process of a conductive substrate, and the like.

In addition, although the example in which a silicon oxide film is formed using the silicon-containing gas as a precursor gas and the oxygen-containing gas as a reaction gas has been described above, the present disclosure is also applicable to forming films using other gases. For example, such other gases include a nitride film, an oxygen-containing film, a nitrogen-containing film, a carbon-containing film, a boron-containing film, a metal-containing film and a film containing a plurality of the above-described elements. Examples of these films may include a SiN film, an AlO film, a ZrO film, an HfO film, a HfAlO film, a ZrAlO film, a SiC film, a SiCN film, a SiBN film, a TiN film, a TiC film, a TiAlC film and the like.

Further, although an apparatus for processing one substrate in one process chamber has been described above, the present disclosure is not limited thereto but may be also applicable to an apparatus in which a plurality of substrates are arranged in the horizontal direction or in the vertical direction.

According to the present disclosure in some embodiments, it is possible to improve the processing uniformity for different substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device in a substrate processing apparatus including a plurality of devices and a controller communicating with the plurality of devices, each of the plurality of devices including a processing performing part, a first transceiver, and an updating part, and the controller including a learning part, an arithmetic part, and a second transceiver, the method comprising:

by the processing performing part, processing a substrate based on a setting parameter corresponding to a process recipe stored in the controller;

by the first transceiver, transmitting a measurement value of the processing performing part to the controller;

by the controller, causing a learning part to perform a machine learning process on the measurement value received from the first transceiver as learning data;

by the controller, after the act of causing the learning part to perform the machine learning process, generating update data for updating the setting parameter;

by the controller, causing an arithmetic part to generate an update parameter for updating the setting parameter based on the update data;

by the controller, causing the second transceiver to transmit the update parameter to the first transceiver; and by the updating part, updating the setting parameter based on the update parameter received from the controller.

2. The method of claim 1, further comprising:
by the controller, before the act of causing the learning part to perform the machine learning process, reading virtual film thickness data corresponding to the measurement value from pre-learning data.

3. The method of claim 2, further comprising:
by the controller, calculating difference data indicating a difference between the virtual film thickness data and film thickness data and determining whether or not the difference data is within a predetermined range.

4. The method of claim 3, further comprising:
by the controller, when the difference data is within the predetermined range, inputting a relationship between the update parameter and the film thickness data to the learning part.

5. The method of claim 2, further comprising:
by the controller, reading a pre-learning parameter corresponding to the measurement value from the pre-learning data and performing a comparing operation as to whether or not a difference between the update parameter and the pre-learning parameter falls within a predetermined range.

6. The method of claim 5, further comprising:
by the controller, notifying an alarm when the difference between the update parameter and the pre-learning parameter exceeds a predetermined value.

7. The method of claim 1, wherein the act of causing the learning part to perform the machine learning process includes using either or both of a neural network and deep learning.

8. The method of claim 2, wherein the act of causing the learning part to perform the machine learning process includes performing learning based on the pre-learning data and the learning data.

9. The method of claim 1, further comprising:
by the controller, changing a timing at which the act of causing the learning part to perform the machine learning process on the measurement value is performed.

* * * * *